United States Patent [19]

Boah

[11] 4,001,047
[45] Jan. 4, 1977

[54] TEMPERATURE GRADIENT ZONE MELTING UTILIZING INFRARED RADIATION

[75] Inventor: John K. Boah, Auburn, N.Y.

[73] Assignee: General Electric Company, Syracuse, N.Y.

[22] Filed: May 19, 1975

[21] Appl. No.: 578,807

[52] U.S. Cl. .............................. 148/1.5; 219/354; 252/62.3 GA; 252/62.3 E; 148/171; 148/172; 148/177; 148/179; 148/187; 148/188

[51] Int. Cl.$^2$ ..................................... H01L 21/225

[58] Field of Search .......... 219/354; 148/171, 172, 148/1.5, 177, 179, 187, 188; 252/62.3 E, 62.3 GA

[56] References Cited

UNITED STATES PATENTS

| | | | |
|---|---|---|---|
| 2,813,048 | 11/1957 | Pfann | 148/1.5 UX |
| 3,627,590 | 12/1971 | Mammel | 148/1.5 |
| 3,897,277 | 7/1975 | Blumenfeld | 148/1.5 |
| 3,898,106 | 8/1975 | Cline et al. | 148/1.5 |
| 3,901,736 | 8/1975 | Anthony et al. | 148/1.5 |
| 3,904,442 | 9/1975 | Anthony et al. | 148/1.5 |

Primary Examiner—G. Ozaki
Attorney, Agent, or Firm—R. J. Mooney; D. E. Stoner

[57] ABSTRACT

Disclosed is a method for selectively doping semiconductor materials utilizing temperature gradient zone melting. The required temperature gradient is provided by infrared radiation impinging on and heating one surface of a body of semiconductor material to be doped. The heat is conducted through the body creating a temperature gradient.

16 Claims, 17 Drawing Figures

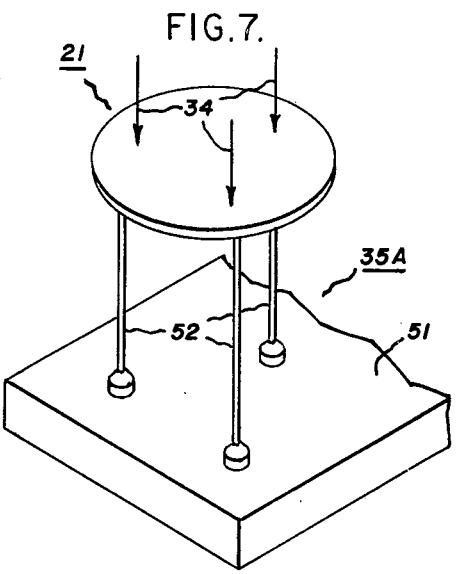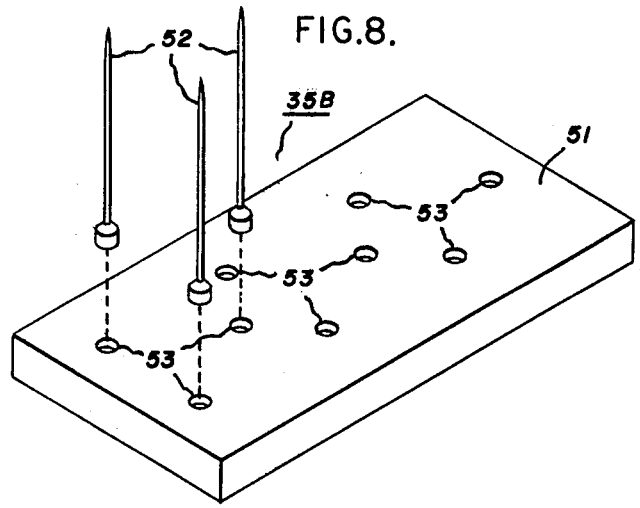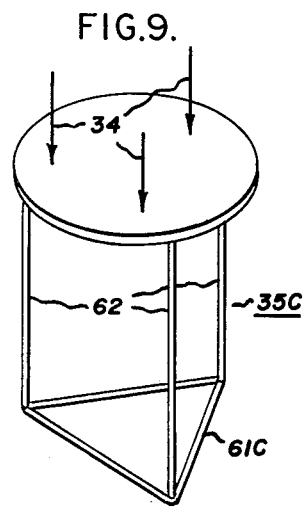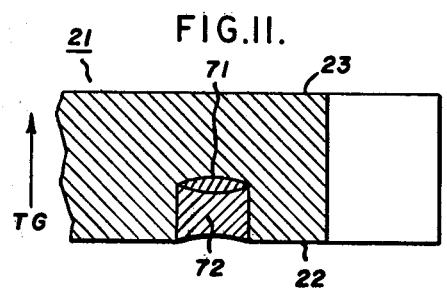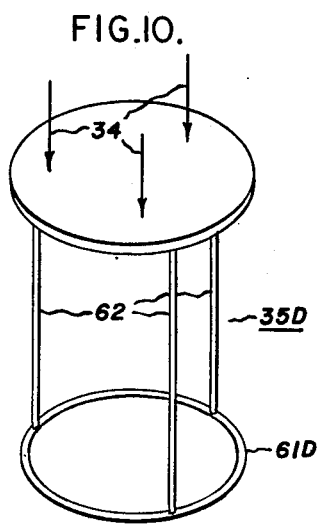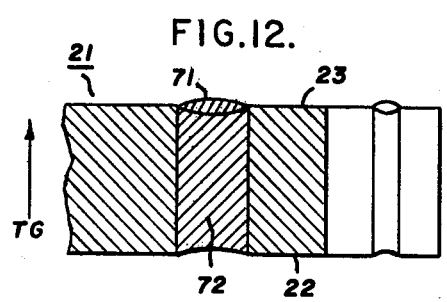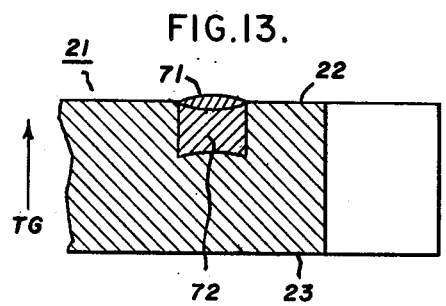

TEMPERATURE GRADIENT ZONE MELTING UTILIZING INFRARED RADIATION

BACKGROUND OF THE INVENTION

This invention relates to the manufacture of semiconductor devices and, more particularly, to a method of doping bodies of semiconductor material by temperature gradient zone melting.

In the manufacture of semiconductor devices it is usually necessary to alter or tailor the conductivity type of a body of semiconductor material. This alteration is provided by distributing atoms of conductivity modifying dopant in a selected region or selected regions of the body. Several techniques for achieving that distribution are widely practiced today. For example, doping is provided by alloying, diffusion, epitaxial growth, etc. The choice among the various methods is made on the basis of such considerations as cost and the character of the junction desired. Alloying, for example, provides very sharp but shallow junctions. Diffusion can provide a deeper junction, but it is less sharp.

Temperature gradient zone melting is a method of doping semiconductor material that can provide very abrupt junctions coupled with high dopant concentrations. Specifically, temperature gradient zone melting provides doped regions containing the solid solubility limit of the dopant. Another virtue of temperature gradient zone melting is that doped regions of unusual configurations can be provided.

Early descriptions of temperature gradient zone melting and some of its applications will be found in U.S. Pat. No. 2,813,048 issued to W. G. Pfann, and in his book Zone Melting, copyright 1958 by John Wiley and Sons, Inc.

While temperature gradient zone melting was known as a method of doping semiconductors very early in the life of the semiconductor industry, certain heretofore unsolved problems have prevented its adoption as a standard tool of the semiconductor device design engineer.

Certainly one of the most difficult to surmount problems has been properly heating the body of semiconductor material. The body of semiconductor material must be heated to an elevated temperature and must have a temperature gradient impressed thereacross. For reasons that will become clear below, the position, direction and uniformity of that gradient is crucial to the successful practice of temperature gradient zone melting.

Several methods of heating have been tried. For example: E-beam (electron-beam), vacuum melting, and placing a workpiece directly on a heated body have all been tested. However, none of these methods has proven completely successful, and each has had its own problems. For example, E-beam is an effective way of heating small areas but to adequately heat an entire semiconductor wafer utilizing E-beam, scanning must be employed and that is difficult to do evenly. A disadvantage associated with vacuum melting is that dopants exhibiting a high vapor pressure at the temperatures employed cannot be used. When heating by contact with a heated body, it has been found difficult to assure uniform contact over the entire wafer area. Thus, undesirable transverse temperature gradients will be present.

In summary, no completely satisfactory heating method for the practice of temperature gradient zone melting on a commercial scale has heretofore been developed.

It is, therefore, an object of this invention to provide a method for heating bodies of semiconductor material during the practice of the temperature gradient zone melting technique which overcomes the aforementioned disadvantages of the prior art.

SUMMARY OF THE INVENTION

This invention is characterized by a method of forming a region of a selected conductivity type in a body of semiconductor material by temperature gradient zone melting. First, a dopant which provides the selected conductivity type is chosen and deposited in a preselected pattern on one surface of the body. Next, the opposite surface of the body is irradiated with a widely distributed field of infrared radiation which causes local surface heating. The heat travels through the semiconductor body, setting up a temperature gradient. Then, by temperature gradient zone melting, the dopant migrates through the body of semiconductor material leaving in its path a region of recrystallized material uniformly doped to the solubility limit of the dopant.

There are many advantages to the use of infrared heating. For example, infrared heating is clean and provides high energy concentration. Very high specimen temperatures are attainable due to the high energy concentration and, furthermore, the elevated temperatures are obtained quickly. The response of the infrared lamps specified below is substantially instantaneous and, for example, a 250 micrometer thick silicon wafer can be heated from room temperature to 1000° C in less than one minute. Furthermore, the process is easy to control inasmuch as the lamps lose approximately 80% of their radiant energy within two seconds after the removal of power. Furthermore, only one surface of the workpiece is heated and thus a temperature gradient is naturally set up as the heat is conducted through the semiconductor body.

Other advantages of infrared radiation as a heat source include that the surrounding support and enclosure materials are not directly heated, thus simplifying handling processes and also conserving energy. Furthermore, quartz infrared lamps are inexpensive and have long lamp life.

Several modifications of the process can be made in order to improve its efficiency. For example, the temperature gradient set up within the body of semiconductor material can be made more uniform and unidirectional by removing heat from the surface of the body opposite that surface on which the infrared radiation impinges. Further improvement can be obtained by performing the process in a closed atmosphere to eliminate the potential cooling effect of gas flowing through the work chamber. Furthermore, it has been found that the quality of the results provided by the process is greatly enhanced by assuring that the dopant melt wets the semiconductor material uniformly prior to the initiation of thermal migration. Uniform wetting can be achieved by alloying the dopant to the semiconductor material. Also, if the dopant is to be applied to only a small portion of the surface of the body, it can be grooved where the dopant is to be placed.

It has been found that the process works most effectively if the surface of the semiconductor body which receives the dopant material is of the planar orientation {111}. And, if the dopant is to be deposited in a linear manner, it is preferable that the lines insofar as possible, be in the <110> crystallographic direction.

Another feature of temperature gradient zone melting is that it permits heavy doping of the semiconductor body. Specifically, it permits doping to the solid solubility limit of the selected dopant. However, lesser doping levels can also be achieved. To achieve a lesser doping level, the dopant is mixed with a carrier material such as platinum, gold, indium, tin or silver, which has little effect on semiconductor conductivity. In this way, the effect of a lower dopant level is achieved since many of the impurity atoms received by the semiconductor are nonconductivity modifying carrier material.

It is known that the solid solubility of one material in another is a function of temperature. Thus, some control over the final doping level can be exercised by varying the temperature at which the process is carried out by adjusting the lamp-workpiece spacing or the lamp power level.

Other options are available when practicing the subject method. For example, the dopant material can be migrated completely through the body of semiconductor material or the process can be terminated with the dopant material remaining frozen inside the semiconductor body and the doped region projecting only part way therethrough. Yet another alternative is to migrate the dopant material partially through the semiconductor body, stop the process, and reverse the temperature gradient such that the dopant material emerges from the body where it entered. Then, the doped zone passes only part way through the body, but the remaining dopant is not frozen therein.

Also disclosed herein is an apparatus for practicing the subject method. A work chamber includes a semiconductor body support that is specifically designed to be of low thermal mass and make minimum area contact with the semiconductor body being supported. The chamber is preferably designed to permit closure so that the process can be performed in a closed atmosphere. Optically coupled to the chamber is a source of widely dispersed infrared radiation. Preferably, cooling blocks are installed on the side of the work chamber opposite the radiation source to help maintain a uniform and unidirectional temperature gradient.

One effective type of semiconductor body support comprises a pair of upstanding members, each of them supporting one or more small thin discs. The spacing between the upstanding members is such that the semiconductor body can be placed on the discs with the discs only slightly overlapping the body. Consequently, the low thermal mass discs contact only a small portion of the semiconductor body. If each of the vertical members includes a plurality of discs, the height at which the semiconductor body is supported (and thus its separation from the lamps) is easily variable and thus the temperature which it reaches is controllable.

Another effective support comprises at least three upstanding pins that are of low thermal mass arranged to fall within an area exhibiting dimensions slightly smaller than that of the semiconductor body to be supported. Thus, the semicondutor body is contacted only at a few points, each near the periphery. Thus, temperature gradient nonuniformity is minimized. The pins can be, for example, quartz or metal wire.

DESCRIPTION OF THE DRAWINGS

These and other features and objects of the present invention will become more apparent upon a perusal of the following description taken in conjunction with the accompanying drawings wherein:

FIG. 7 is an isometric view of another semiconductor body support which utilizes upstanding quartz pins;

FIG. 8 is an isometric view of a modification of the support depicted in FIG. 7;

FIG. 9 illustrates yet another body support system that can be employed with the heater depicted in FIG. 3;

FIG. 10 is an isometric view of a modification of the support shown in FIG. 9;

FIG. 11 is a detail view similar to FIG. 2 and shows the wafer after the thermal migration process has been initiated;

FIG. 12 is a view corresponding to FIG. 11 after the dopant material has been migrated completely through the wafer;

FIG. 13 shows the wafer of FIG. 2 following a modification of the subject process in which the temperature gradient is reversed during the migration and the dopant material is migrated back out to the surface from which it entered the semiconductor body;

DESCRIPTION OF THE PREFERRED METHOD

Temperature gradient zone melting, as practiced in the semiconductor industry, is a process in which a small amount of dopant is placed on a body of semiconductor material and the combination is exposed to a temperature gradient at an elevated temperature. The overall temperature at which the process is carried out must be sufficiently high that a melt containing both materials will be formed. The temperature gradient can vary from a few degrees to a few hundred degrees across the body of semiconductor material. Under these conditions, the melt will migrate directly along the temperature gradient lines from low temperature toward high temperature leaving in its path a recrystallized region of semiconductor material containing the solid solubility limit of the dopant.

Thus, certain important process considerations become evident. For example, the temperature gradient must be uniform and must be precisely oriented if good process control is to be achieved, for if the gradient is irregular or misdirected, the resulting doped zone will be irregular or misdirected.

For a more complete description of the subject thermal migration process, attention is directed to the copending application of Thomas R. Anthony and Harvey E. Cline entitled "Deep Finger Diodes" Application Ser. No. 559,262, filed Mar. 17, 1975, assigned to the same assignee as this application.

Figure 1:
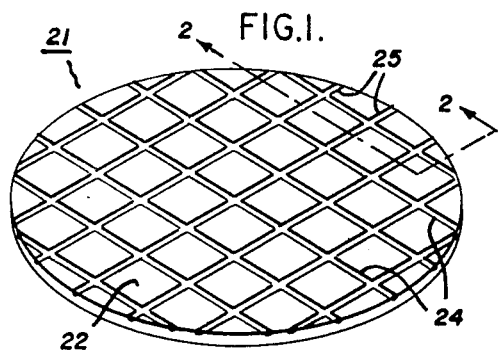
FIG. 1 is an isometric view of a semiconductor wafer with a suitable pattern of dopant deposited thereon to permit practice of the subject method.
Figure 2:
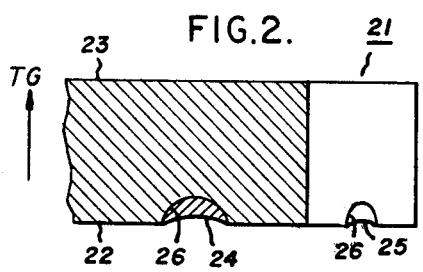
FIG. 2 is a sectional detail view of a portion of the wafer shown in FIG. 1 in an inverted position.

Referring first to FIGS. 1 and 2, there is shown a body of semiconductor material 21. The material can be silicon, germanium, silicon carbide, gallium arsenide, a compound of a group II element and a group VI element, or a compound of a group III element and a group V element. For purposes of illustration, the body 21 can be considered a wafer of n-type silicon defining a first major surface 22 and a second major surface 23 as clearly shown in FIG. 2. It will be appreciated that FIG. 2 is shown in an inverted orientation with respect to FIG. 1. The wafer is shown as inverted because it is in that inverted position during thermal migration.

Normally the wafer 21 will have a wide distribution of atoms of a dopant material that induces a given conductivity type in the silicon. Generally, this given conductivity type will be the opposite conductivity type of the dopant that is to be thermally migrated through the wafer 21.

The first step in the subject thermal migration process is to deposit on the surface 22, in a preselected pattern, a quantity of dopant material that will impart to the silicon a selected conductivity type. An example of a dopant that works well with silicon is aluminum. It should be stressed at this point that the preselected pattern can be any pattern desired and can in fact include the entire surface 22 of the wafer 21. However, as illustrated in FIG. 1, the preselected pattern includes a plurality of orthogonal linear regions 24 and 25 that divide the wafer 21 into a grid. Thus, the dopant can be applied in the form of a plurality of aluminum wires.

Preferably, the wafer is formed so that the surfaces 22 and 23 are in the 111 crystallographic plane. Under these conditions, the linear aluminum wires 24 should be in the <110> orientation. Other exemplary stability conditions are included in the following table:

| Wafer Plane | Migration Direction | Stable Wire Directions | Stable Wire Sizes |
|---|---|---|---|
| {100} | < 100 > | < 011 >* | <100 microns |
| | | < 011 >* | <100 microns |
| {110} | < 110 > | < 110 >* | <150 microns |
| {111} | < 111 > + a) | < 011 > | |
| | | < 101 > | <500 microns |
| | | < 110 > | |
| | b) | < 112 >* | |
| | | < 211 >* | <500 microns |
| | | < 121 > | |
| | c) | Any other* direction in {111} plane* | <500 microns |

*The stability of the migrating wire is sensitive to the alignment of the thermal gradient with the <100>, <110> and <111> axis, respectively.
+Group a is more stable than group b which is more stable than group c.

Referring now only to FIG. 2, it will be appreciated that the wires 24 and 25 lie in grooves 26 in the surface 22. Furthermore, the wires 24 and 25 are preferably alloyed to the surface 22 in the grooves 26. The alloying is beneficial inasmuch as a melt will be formed in the groove prior to the initiation of thermal migration and the melt should uniformly wet the silicon for best results. The alloying step helps assure uniform wetting.

Figure 3:
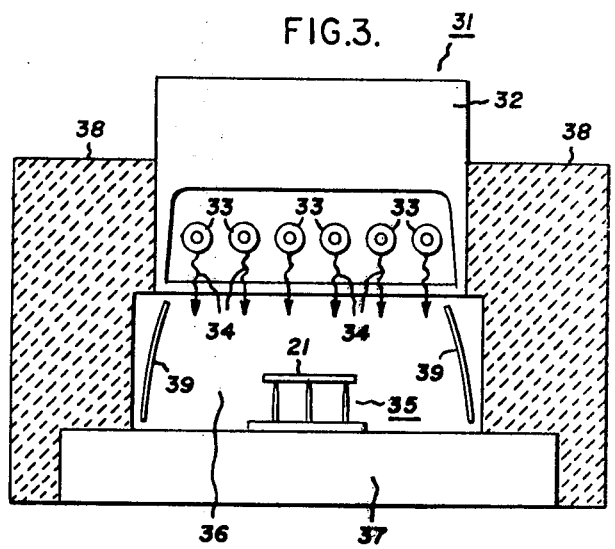
FIG. 3 is a diagrammatic illustration of a heating apparatus built in accordance with the subject invention.

Referring now to FIG. 3, there is illustrated in schematic form a heating apparatus 31 for practicing temperature gradient zone melting with the wafer 21 depicted in FIGS. 1 and 2. I have discovered that widely dispersed infrared radiation is an effective energy source for heating the work during the practice of temperature gradient zone melting and this discovery forms the basis for the heater 31. As will be explained below, the radiation automatically provides the temperature gradient.

The apparatus 31 includes an energy radiator 32 comprising a plurality of infrared lamps 33 that emit infrared radiation 34.

Utilizing infrared radiation as an energy source, it has been found that at 1250° C, with a temperature gradient of 111° per cm, aluminum will migrate through a 180 micrometer thick wafer in approximately 2 – 5 minutes. Such temperatures and gradients can be achieved by the utilization of a model 5208–16 high density radiant heater, manufactured by Research, Inc., Minneapolis, Minn., with six GE 3200 T, 3/lcL Quartz Infrared Lamps, available from the General Electric Company. The wafer is held approximately 5 cm from the lamps. The plurality of lamps used provides a uniform field of radiation. The heater is connected to power and coolant sources in accordance with the manufacturer's instructions.

In a work chamber 36, that is preferably formed of clear quartz glass to permit the flow of infrared radiation thereinto, the wafer 21 is positioned on a support 35. Preferably, the work chamber is fitted with removable end caps so that the atmosphere therein can be closed during the temperature gradient zone melting process. The caps need not be absolutely air tight but should substantially eliminate potential drafts through the chamber.

The wafer 21 is placed on the support 35 with the surface 23 up, and the infrared radiation 34 striking the upper surface 23 of the wafer causes heating on that entire surface. Heat conducted through the wafer naturally sets up the gradient. The spacing between the lamps and the wafer can be varied to control the wafer temperature. A spacing of 5 centimeters provides a wafer temperature of about 1250° C and a temperature gradient of about 111° C per cm across a 180 micrometer thick wafer.

It has been found that the gradient can be made more unidirectional, uniform, and somewhat more intense by the inclusion of a thermally massive cooling block 37 below the wafer 21 to remove heat from the lower surface of the wafer. It has been found that any thermally massive material, such as a metal, works well as a cooling block. It will be observed that no effort is made to keep the wafer 21 and the cooling block 37 in physical contact. It is felt that such physical contact is not necessary for performance of the process and is in any event difficult to achieve because the wafer may bow slightly during the process, causing only partial contact with the block. Such partial contact causes transverse temperature gradients.

Marginal reflectors 39 can be employed to restrict dispersion of the radiation. It is felt that the inclusion of the reflectors contributes to a more uniform gradient.

Finally, optical shielding 38 is included around the apparatus 31 to protect the operators. The shielding can comprise, for example, ceramic bricks piled around the apparatus. Nearly any material should work as long as it is opaque to the infrared radiation. If the work chamber is opaque, with only a transparent window to admit the radiation, the shielding can be dispensed with.

It should also be pointed out that the surface of the wafer which faces the lamps should be as uniform as possible to insure uniform energy absorption. Thus, etching or polishing the surface 23 is helpful. The absorption of energy is also strongly dependent of free carrier density. Thus regions of high impurity concentrations or metallic precipitations will strongly absorb the light. Hence, doping the surface 23 greatly enhances the absorption efficiency of the body 21 and also makes absorption more uniform.

Figure 4:
FIG. 4 is an isometric view of the heater of FIG. 3.
Figure 5:
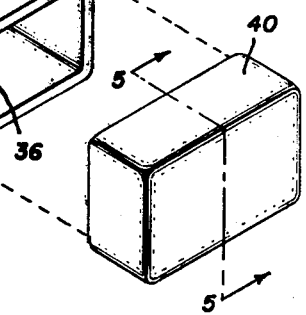
FIG. 5 is a sectional view of an end cap used with the aforementioned heater.

FIG. 4 isometrically shows the heater with the shield removed, illustrating the juxtaposition of the radiant heater 32, the work chamber 36 and the cooling block 37. The quartz tube forming the work chamber is longer than the heater and cooling block to facilitate the installation of end caps 40, which are shown in section in FIG. 5. It is considered preferable to enclose the end caps within the shield prior to operation of the apparatus.

In the apparatus as described, only the silicon is heated. The rest of the apparatus remains relatively cool.

Figure 6:
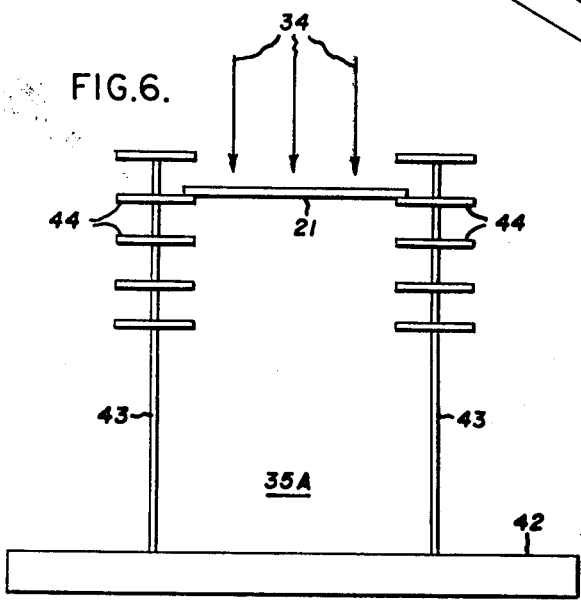
FIG. 6 illustrates one type of semiconductor body support that can be used in conjunction with the heater depicted in FIG. 3.

Referring next to FIG. 6, there is shown one form of support 35A for the semiconductor body 21. A base 42 carries at least two upstanding supports 43, each of which supports a plurality of small, low mass discs 44. The entire structure is preferably made of material such as quartz. The wafer 21 fits on two discs 44 as illustrated and is contacted only at small areas at the periphery by the slightly overlapping discs 44. Thus, it will be appreciated from an observation of FIG. 6 that there is little interference with the infrared radiation 34 reaching the wafer 21.

The support 35A can be made with three or more upstanding supports 43 so that three or more discs 44 contact the wafer 21. However, this is unnecessary in most circumstances and, inasmuch as some nonuniformity of the thermal gradients is caused by the contact of each disc, it is preferable that only two upstanding supports 43 be used when possible. Furthermore, it will be appreciated that only one disc 44 needs be present on each upstanding support 43. However, it is considered helpful to include a plurality of discs 44 to facilitate rapid height adjustment of the wafer 21.

Referring now to FIG. 7, there is isometrically illustrated an alternate support 35B. A base 51 supports three upstanding pins 52 which support the wafer 21 by contacting it at three spaced points near its periphery. The base 51 and pins 52 are preferably made of clear quartz.

Inasmuch as it is desired with respect to the support 35B, and with respect to all other supports disclosed, that minimal contact be made with the semiconductor wafer 21, the pins 52 can be pointed on their ends. Minimal contact is desired to prevent excess bending of the thermal gradient. One advantage derived from the use of the support 35B is that absolutely no interference is presented to the infrared radiation 34 impinging on the wafer 21 from above.

Referring now to FIG. 8, there is illustrated an exploded view of the support 35B. It will be appreciated that the pins 52 are removably retained in cylindrical openings 53 in the base 51. An advantage of removable pins 52 is that should one pin become broken it can quickly and easily be replaced. That is an important consideration when dealing with the relatively brittle quartz material.

It will also be appreciated from an observation of FIG. 8 that a plurality of sets of openings 53 is provided and thus by utilizing 9 pins, 3 wafers can be supported simultaneously. Depending upon the size of the heating apparatus, the base 51 can be made longer, and more than three wafers can be supported thereon.

Referring now to FIG. 9, there is illustrated isometrically another wafer support 35C. The support 35C is constructed of wire with a wire base 61C and three upstanding support wires 62. Functionally, the support 35C is similar to the support 35B. Coupling between the upstanding wires 62 and the base 61C can be by any conventional means such as welding, or the upstanding wires 62 can be wrapped around the base several times.

Next, referring to FIG. 10, there is shown a support 35D, which is similar to the support 35C except that the wire base 61D is circular rather than triangular.

Referring again to FIG. 2, if the wafer 21 is placed in the heating apparatus with the surface 23 up so that the temperature gradient is in the direction of the arrow TG, the temperature gradient zone melting process will begin when the infrared lamps are energized. First, an aluminum rich melt of silicon will be formed in the groove 26. That melt will begin to dissolve the silicon on the hottest side thereof (that is, as viewed in FIG. 2, above it). Concurrently, the melt will begin to recrystallize on the coolest side thereof. Thus, referring to FIG. 11, the melt 71 will migrate into the thickness of the wafer 21 in an upward direction. Behind the melt 71 will be left a recrystallized region 72 of silicon doped with aluminum to the solid solubility limit and consistent with the segregation coefficient of aluminum in silicon.

If the process is continued for a sufficient period of time (typically 2 to 15 minutes depending on wafer thickness, temperature, gradient, etc.), the melt 71 will emerge on the hot side 23 of the wafer. Then, the recrystallized region 72 will pass through the entirety of the wafer. Thus, if the process is carried on to the extent illustrated in FIG. 12, and the wafer was initially of the form illustrated in FIG. 1, each of the rectilinear areas 73 in the wafer 21 is isolated from all the other areas by back-to-back, p-n junctions formed on each side of the recrystallized regions 72.

If the infrared radiation is turned off at the stage illustrated in FIG. 11, the aluminum rich droplet 71 freezes in situ and remains in the silicon. For certain applications it is advantageous to place such buried conductive layers in silicon.

Another option is to terminate the process at the position illustrated in FIG. 11 as described above, and then to invert the wafer so that the side 22 is nearest the infrared radiation source. The process is again initiated with the temperature gradient as illustrated by the arrow TG in FIG. 13. Then, the aluminum rich droplet 71 retraces its path and emerges on the surface 22 leaving behind the recrystallized region 72 projecting just part way through the wafer 21. This is illustrated in FIG. 13.

It will be appreciated that following any of the above described migration procedures which terminates with a solidified droplet 71 on either surface of the wafer 21, the excess dopant can be removed by lapping, etching or the like.

Figure 14:
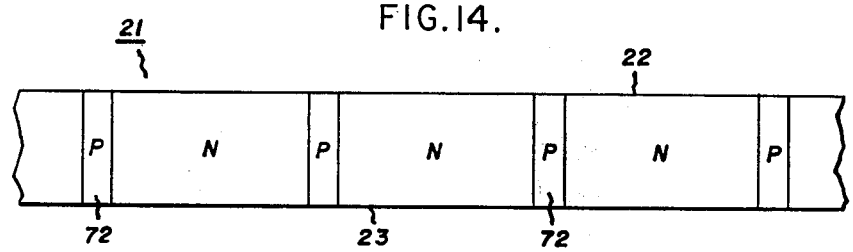
FIG. 14 is a sectional elevation view of a portion of a semiconductor wafer that has had a plurality of dopant wires migrated therethrough in accordance with the subject invention.

Following is an illustration of a semiconductor device made utilizing the temperature gradient zone melting process. Referring first to FIG. 14, there is a sectional elevation view of a larger portion of the wafer 21 that has been processed to the point illustrated in FIG. 12. That is, the aluminum rich droplets 71 have been migrated completely through. Furthermore, the surface 23 of the wafer 21 has been lapped to remove the recrystallized droplet on the surface.

Since it was assumed that the wafer 21 was initially doped to be of n-type conductivity and the recrystallized regions 72 are aluminum rich, the plurality of heavily doped P-type regions form an isolation grid structure separating individual n-conductivity type regions of the wafer.

Figure 15:
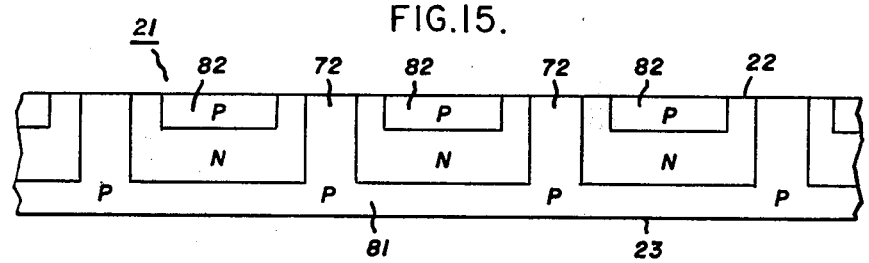
FIG. 15 illustrates a subsequent processing step employed in an illustrative process utilizing the wafer depicted in FIG. 14.

Next, assume that an additional p-type region 81 is diffused into the entire surface 23. Simultaneously, p-type regions 82 are diffused into the surface 22 of the wafer 21. This is illustrated in FIG. 15. The diffusion into the surface 23 is, of course, a blanket diffusion. Conventional steps such as oxide masking can be used to restrict the diffusion in the upper surface 22 to the regions 82.

Observation of FIG. 15 will show that during the diffusion process, the aluminum atoms in the recrystallized regions 72 diffuse outwardly and thus the regions 72 have widened somewhat.

Figure 16:
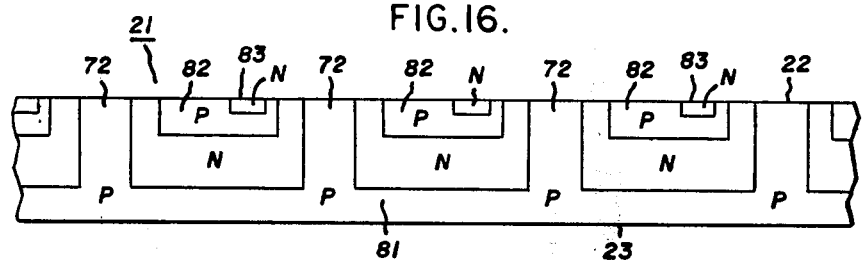
FIG. 16 illustrates the wafer of FIG. 14 following yet further processing.

Referring next to FIG. 16, it is seen that a small n-type region 83 is diffused into each p-type region 82. That diffusion process also involves conventional techniques such as oxide masking. In order to preserve clarity, the oxide layers have been omitted from FIGS. 14 – 16.

Those skilled in the semiconductor art will recognize that the wafer 21 in FIG. 16 now comprises a plurality of semiconductor controlled rectifiers.

Figure 17:
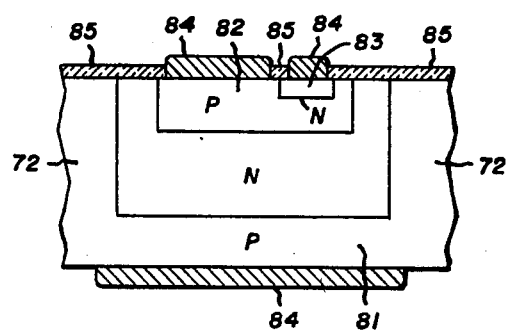
FIG. 17 is a sectional elevation view of semiconductor controlled rectifiers (SCR) manufactured in accordance with the techniques discussed with respect to FIGS. 14–16.

Referring now to FIG. 17, the wafer 21 is metallized by conventional techniques to provide three metallized contacts 84 on each SCR. Then, by leaving the oxide 85 (which was not shown in previous Figures, but is naturally formed during the conventional diffusion steps) in the positions illustrated on the surface 22, it will be appreciated that each p-n junction is passivated. The wafer then can be subdivided by such techniques as scribing and breaking through the recrystallized regions 72 to provide individual passivated SCR pellets as illustrated in FIG. 17.

Many modifications and variations of the above teachings will be obvious to those skilled in the art. For example, if a lower level doping is desired in the recrystallized regions 72, the dopant can be mixed with an appropriate amount of a carrier material such as gold or platinum and then thermally migrated. The carrier material is selected to be one with little effect on semiconductor conductivity. Therefore, it is to be understood that the true scope of the invention is as defined by the following claims.

What is claimed is:

1. A method of forming a region of a selected conductivity type in a body of semiconductor material comprising the steps of:
   providing a body of semiconductor material;
   depositing a quantity of a dopant on one surface of said body, said dopant being deposited in a predetermined pattern and being of a selected conductivity type;
   exposing the surface of said body opposite said one surface to infrared radiation, said radiation having an intensity such that said dopant thermally migrates into said body toward said opposite surface and leaves in its path in said semiconductor material a region of recrystallized material uniformly doped to the solid solubility limit of said dopant.

2. A method according to claim 1 wherein said method further comprises removing heat from said one surface of said body.

3. A method according to claim 2 wherein said method further includes sealing said body in a closed atmosphere prior to exposing the opposite surface to said radiation.

4. A method according to claim 3 wherein said body is a wafer of silicon comprising a distributed dopant of the opposite conductivity type.

5. A method according to claim 4 wherein said one surface of said wafer and the opposite surface area in a crystallographic plane selected from the group 111 .

6. A method according to claim 5 wherein said dopant is deposited on linear portions of said one surface and said linear portions are in directions selected from the group <110>.

7. A method according to claim 6 wherein said linear portions define orthogonal directions.

8. A method according to claim 7 wherein said dopant is aluminum.

9. A method according to claim 3 further comprising the steps of grooving said surface in said preselected pattern prior to the deposition of said dopant and alloying said dopant to said surface in the grooves prior to thermal migration.

10. A method according to claim 1 wherein said dopant passes through said body and emerges on the opposite surface.

11. A method according to claim 1 further comprising, after said step of exposing the opposite surface, the step of exposing said one surface to the radiation such that said dopant thermally migrates back to said one surface.

12. A method according to claim 11 wherein said step of exposing the opposite surface to the radiation is terminated prior to the emergence of said dopant on the opposite surface.

13. A method according to claim 1 wherein said dopant is distributed in a carrier material which is deposited on said body in said preselected patterns, said carrier material being selected from the group consisting of gold, platinum, indium, tin and silver.

14. A method according to claim 1 further comprising, prior to said exposing step, the step of rendering the opposite surface uniform.

15. A method according to claim 14 wherein said step of rendering comprises polishing.

16. A method according to claim 14 wherein said step of rendering comprises etching.

* * * * *